United States Patent
Shim

(10) Patent No.: US 7,646,049 B2
(45) Date of Patent: Jan. 12, 2010

(54) IMAGE SENSOR AND FABRICATING METHOD THEREOF

(75) Inventor: Cheon-Man Shim, Seoul (KR)

(73) Assignee: Dongbu HiTek Co., Ltd., Seoul (KR)

( * ) Notice: Subject to any disclaimer, the term of this patent is extended or adjusted under 35 U.S.C. 154(b) by 158 days.

(21) Appl. No.: 11/844,714

(22) Filed: Aug. 24, 2007

(65) Prior Publication Data
US 2008/0054299 A1    Mar. 6, 2008

(30) Foreign Application Priority Data
Aug. 29, 2006    (KR) .................. 10-2006-0082544

(51) Int. Cl.
*H01L 31/062* (2006.01)
(52) U.S. Cl. ............... 257/292; 257/435; 257/E31.123; 438/70; 250/208.1
(58) Field of Classification Search .......... 257/432, 257/435, 443
See application file for complete search history.

(56) References Cited

U.S. PATENT DOCUMENTS

| | | | | |
|---|---|---|---|---|
| 7,193,289 B2* | 3/2007 | Adkisson et al. | ............ | 257/431 |
| 7,358,583 B2* | 4/2008 | Reznik et al. | ............... | 257/432 |
| 7,432,530 B2* | 10/2008 | Yamashita et al. | ............ | 257/72 |
| 2005/0001146 A1* | 1/2005 | Quinlan | ................... | 250/214.1 |
| 2005/0139750 A1* | 6/2005 | Dobashi et al. | .......... | 250/208.1 |
| 2005/0236553 A1* | 10/2005 | Noto et al. | ............... | 250/208.1 |
| 2006/0138577 A1* | 6/2006 | Hashimoto | .................. | 257/432 |

OTHER PUBLICATIONS

T. H. Hsu et al., Light Guide for Pixel Crosstalk Improvement in Deep Submicron CMOS Image Sensor, IEEE Electron Device Letters, vol. 25, No. 1, Jan. 2004.

* cited by examiner

*Primary Examiner*—Sue Purvis
*Assistant Examiner*—Benjamin P Sandvik
(74) *Attorney, Agent, or Firm*—Sherr & Vaughn, PLLC

(57) ABSTRACT

An image sensor includes a photo diode formed over a semiconductor substrate. At least one IMD layer is formed on the semiconductor substrate. A dielectric medium fills a through-hole formed in the IMD layer over the photo diode. The dielectric medium may be made with materials with a higher refractive index than the materials forming the IMD layer.

19 Claims, 7 Drawing Sheets

IMAGE SENSOR AND FABRICATING METHOD THEREOF

The present application claims priority under 35 U.S.C. 119 and 35 U.S.C. 365 to Korean Patent Application No. 10-2006-0082544 (filed on Aug. 29, 2006), which is hereby incorporated by reference in its entirety.

BACKGROUND

An image sensor is a semiconductor device that may convert optical images into electrical signals. The sensitivity of an image sensor may be increased by increasing the speed and efficiency of the conversion of an incident light signal into an electrical signal.

In order to obtain a brighter and clearer image, the sensor may use a micro lens to concentrate light in a photo diode. The lens may also help to prevent light from impinging on neighboring cells. When incident light is not focused on the photo diode, cross-talk affecting neighboring cells may occur, which may degrade an image. To increase the speed of an image sensor, a relatively high stacked metal layer may be required. However, a relatively high stacked metal layer may create a constraint on the focal length of the micro lens. In order to maintain the focal length while reducing the pitch, the lens shape may be maintained while reducing the height of the micro lens. This may result in difficulties in a fabrication process.

SUMMARY

Embodiments relate to an image sensor and a fabrication method that may improve sensitivity by effectively transferring incident light to a photo diode area. In embodiments, an image sensor may include at least one of the following: A semiconductor substrate formed with a photo diode. At least one IMD layer formed on and/or over the semiconductor substrate. A dielectric medium formed penetrating through the IMD layer positioned on and/or over the photo diode, including at least one material with a higher refractive index than the IMD layer.

Embodiments relating to a method of fabricating an image sensor including at least one of the following steps: Forming at least one IMD layer on and/or over a semiconductor substrate formed with a photo diode. Forming a through-hole that penetrates through an IMD layer positioned on and/or over the photo diode. Filling the through-hole with a dielectric medium.

DRAWINGS

Example FIGS. 1 to 5 illustrate a method of fabricating an image sensor, according to embodiments.

Figure 6:
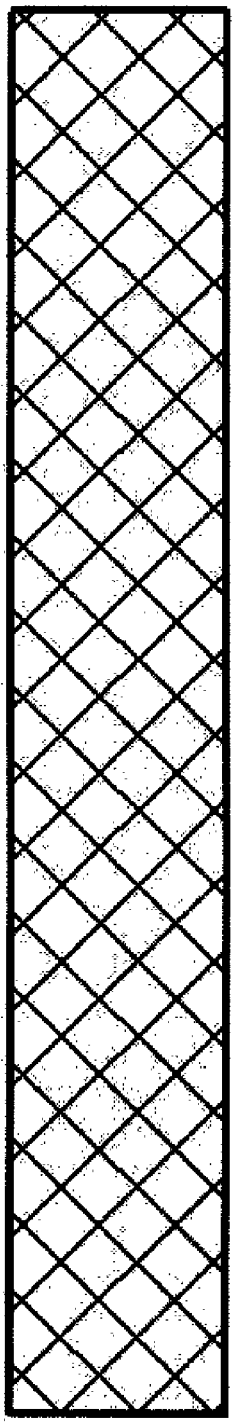
Figure 6:
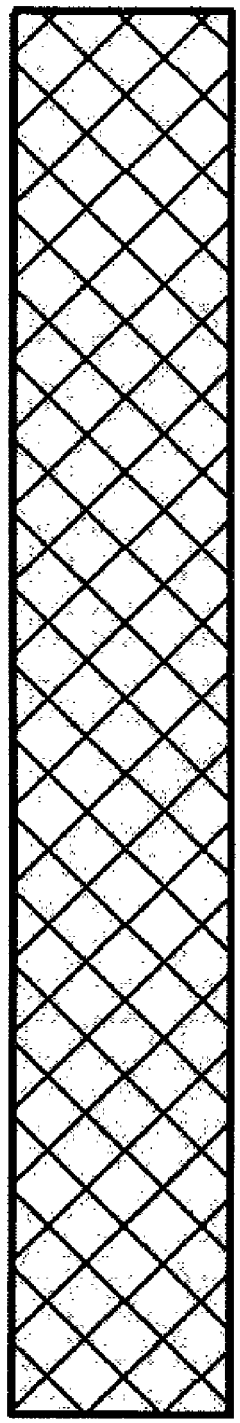
Figure 6:
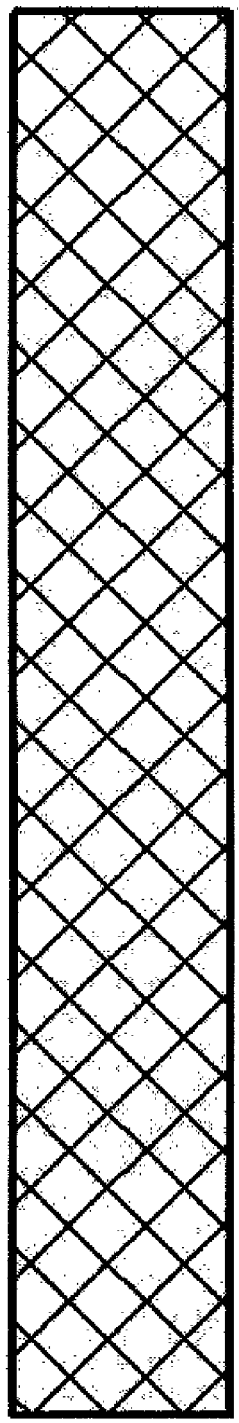
Figure 7:
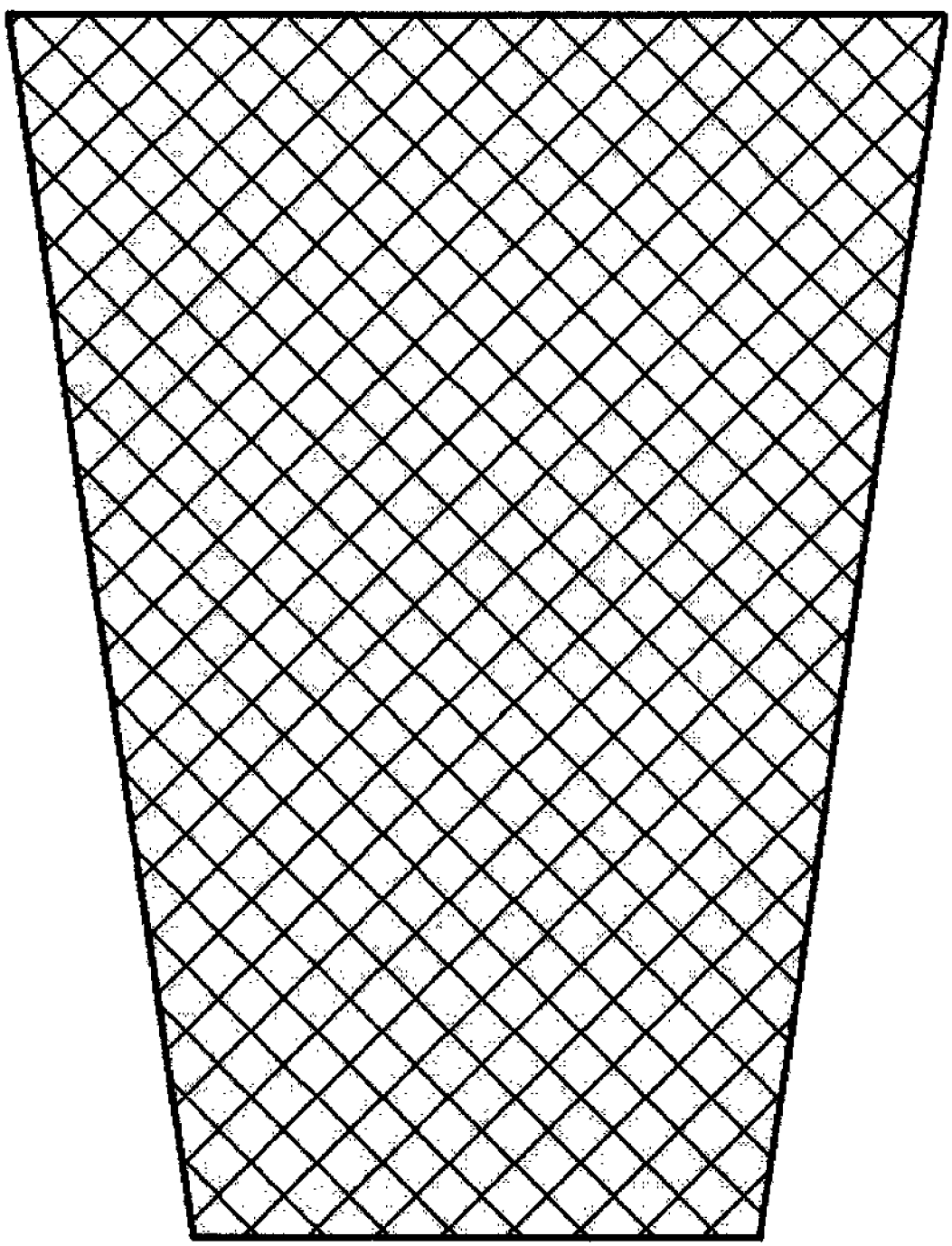

Example FIGS. 6 and 7 illustrate shapes of a dielectric medium for propagating light in the image sensor, according to embodiments.

DESCRIPTION

Figure 1:
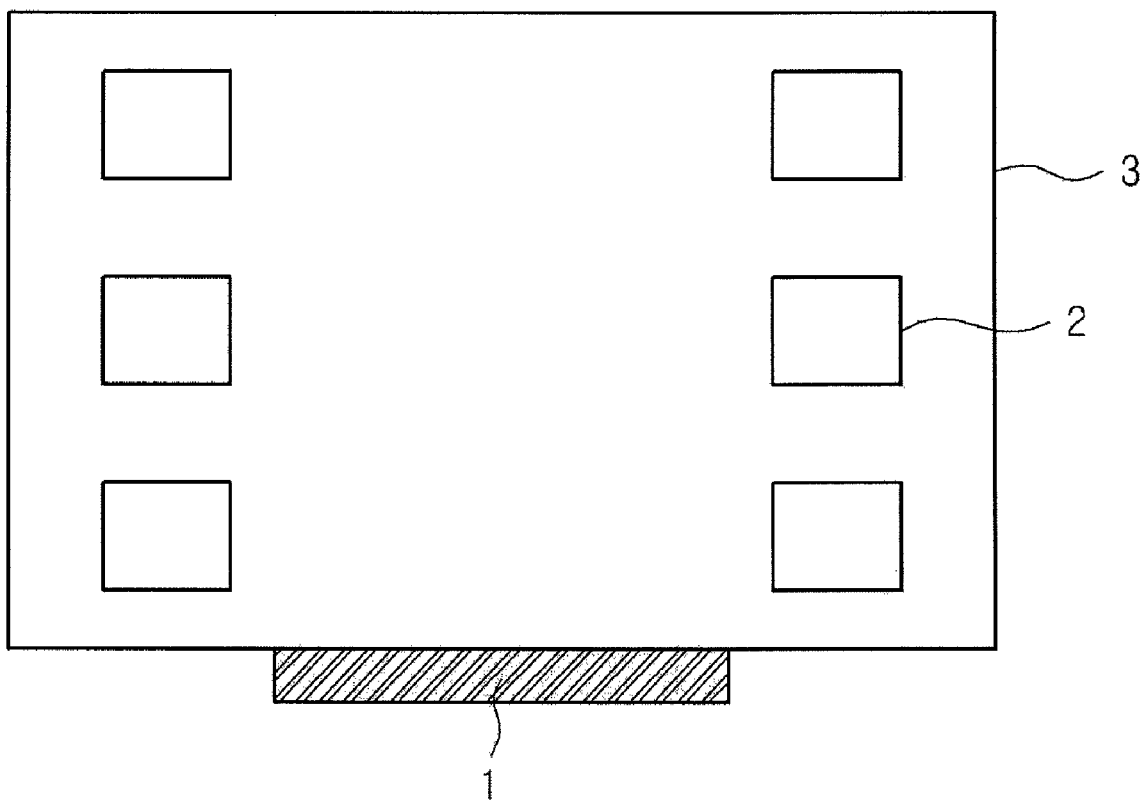

Example FIG. 1. illustrates intermetal dielectric (IMD) layer 3, wiring 2, and photo diode 1, in accordance with embodiments. According to embodiments, at least one IMD layer 3 is formed over and/or on a semiconductor substrate on which a photo diode 1 is formed, as shown in FIGS. 1 to 5. IMD layer 3 may include a pre-metal dielectric (PMD) layer and an IMD layer, in accordance with embodiments. The IMD layer may incorporate wiring 2.

Figure 2:
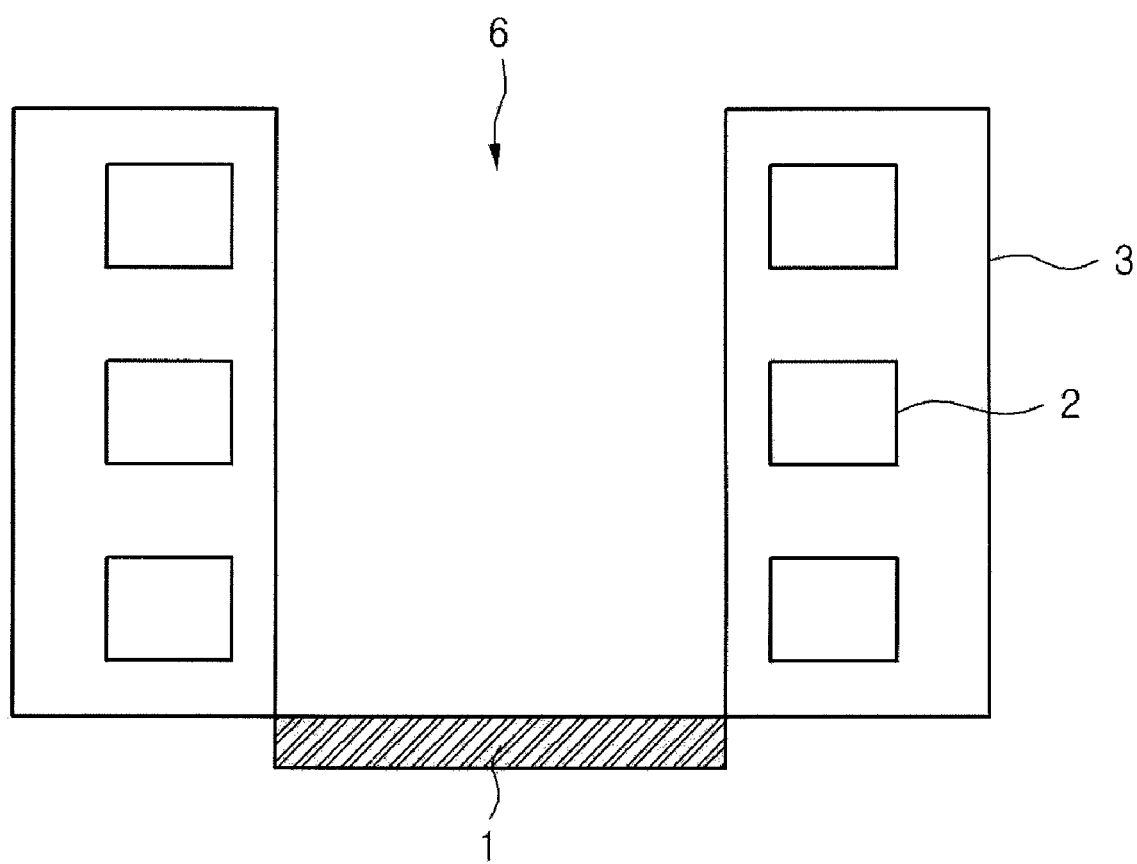

As illustrated in example FIG. 2, through-hole 6 may be formed penetrating through IMD layer 3, in accordance with embodiments. Through-hole 6 may be formed after a back end of line (BELO) process (e.g. forming a metal wiring layer) is complete. In embodiments, through-hole 6 may penetrate through IMD layer 3 in an area over photo diode 1.

Figure 3:
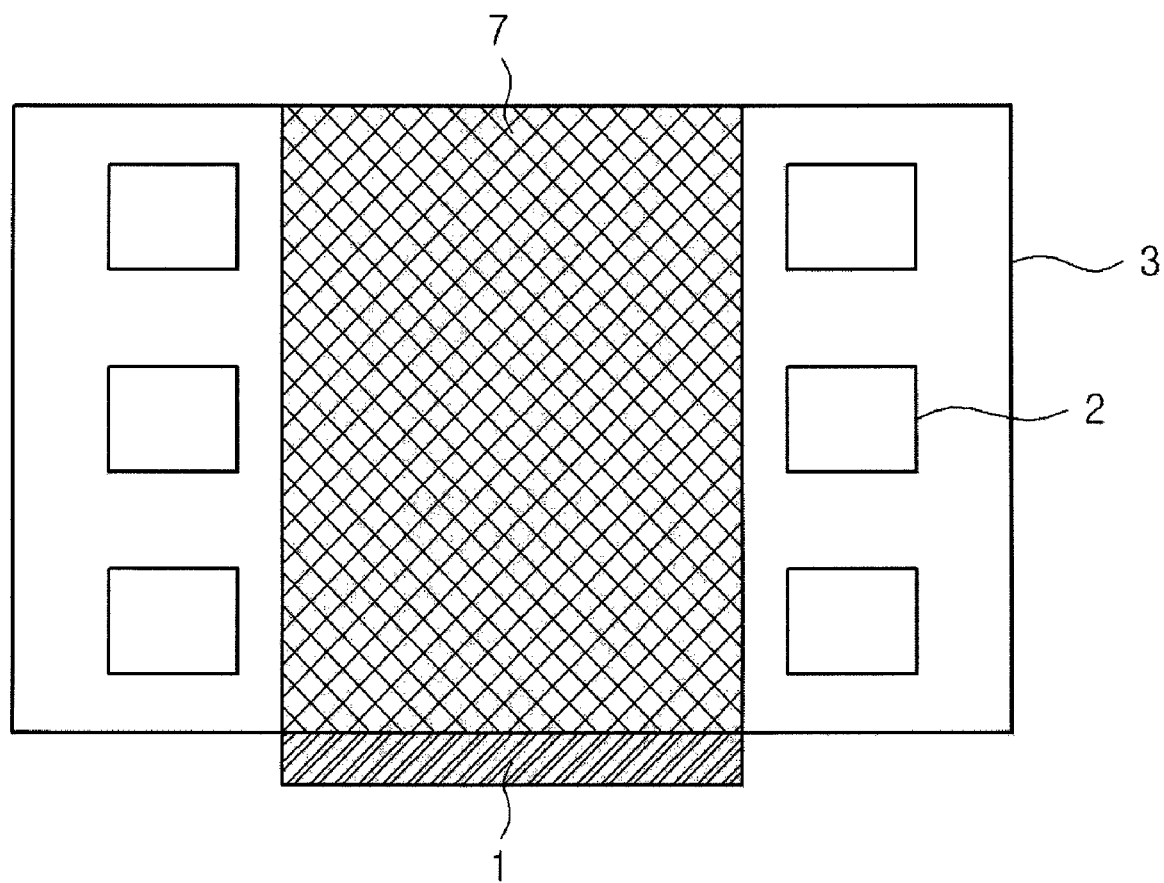

As illustrated in example FIG. 3, through-hole 6 may be filled with a dielectric medium 7, in accordance with embodiments. In embodiments, dielectric medium 7 may include materials that have a higher refractive index than materials included in IMD layer 3. Light may be reflected at a boundary between dielectric medium 7 and IMD layer 3, allowing reflected light to be reflected to photo diode 1. Dielectric medium 7 may be formed of multiple layers, in accordance with embodiments.

According to embodiments, the dielectric medium 7 may be formed by deposition methods such as PVD, CVD, and other similar methods appreciated by those skilled in the art. After dielectric medium 7 is formed, a planarization process may be performed on dielectric medium 7, in accordance with embodiments. In embodiments, the dielectric medium 7 may be formed by coating (e.g. spin coating).

Figure 4:
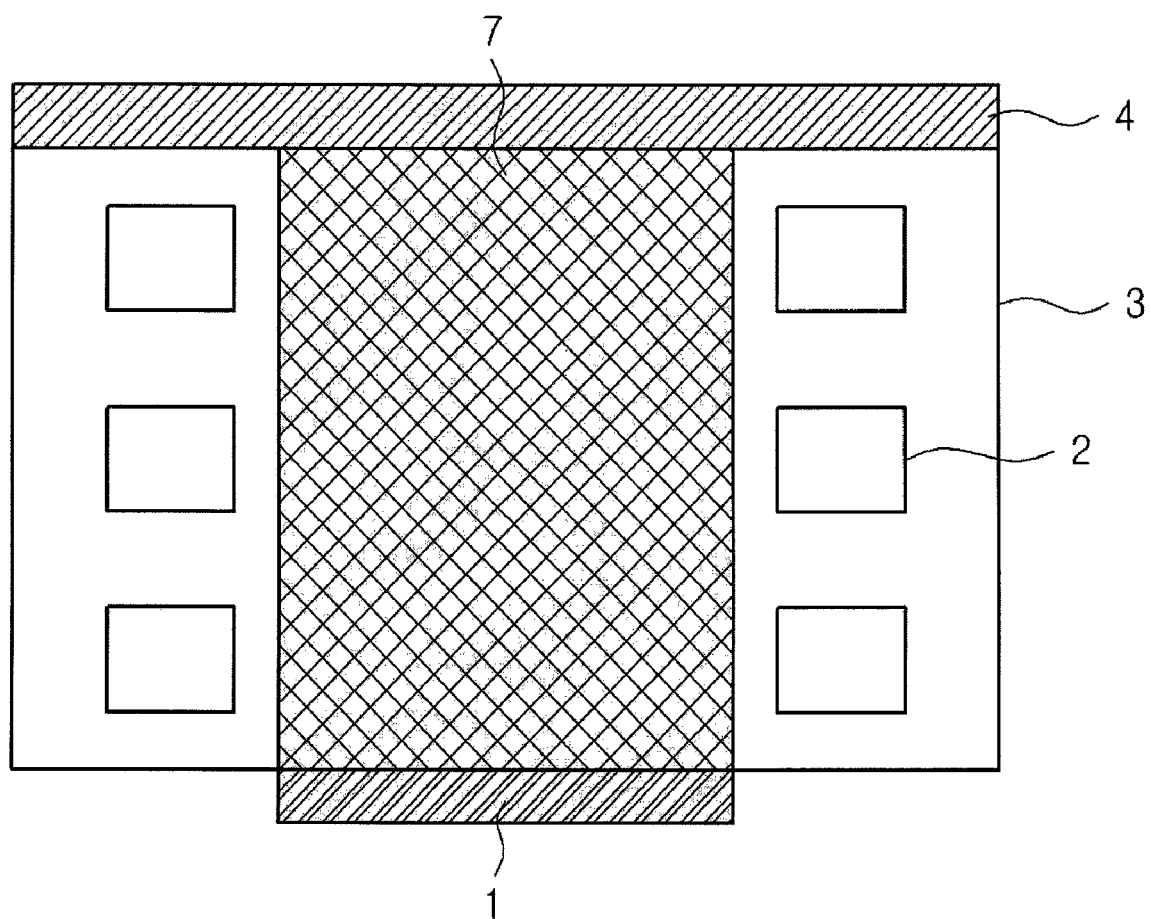
Figure 5:
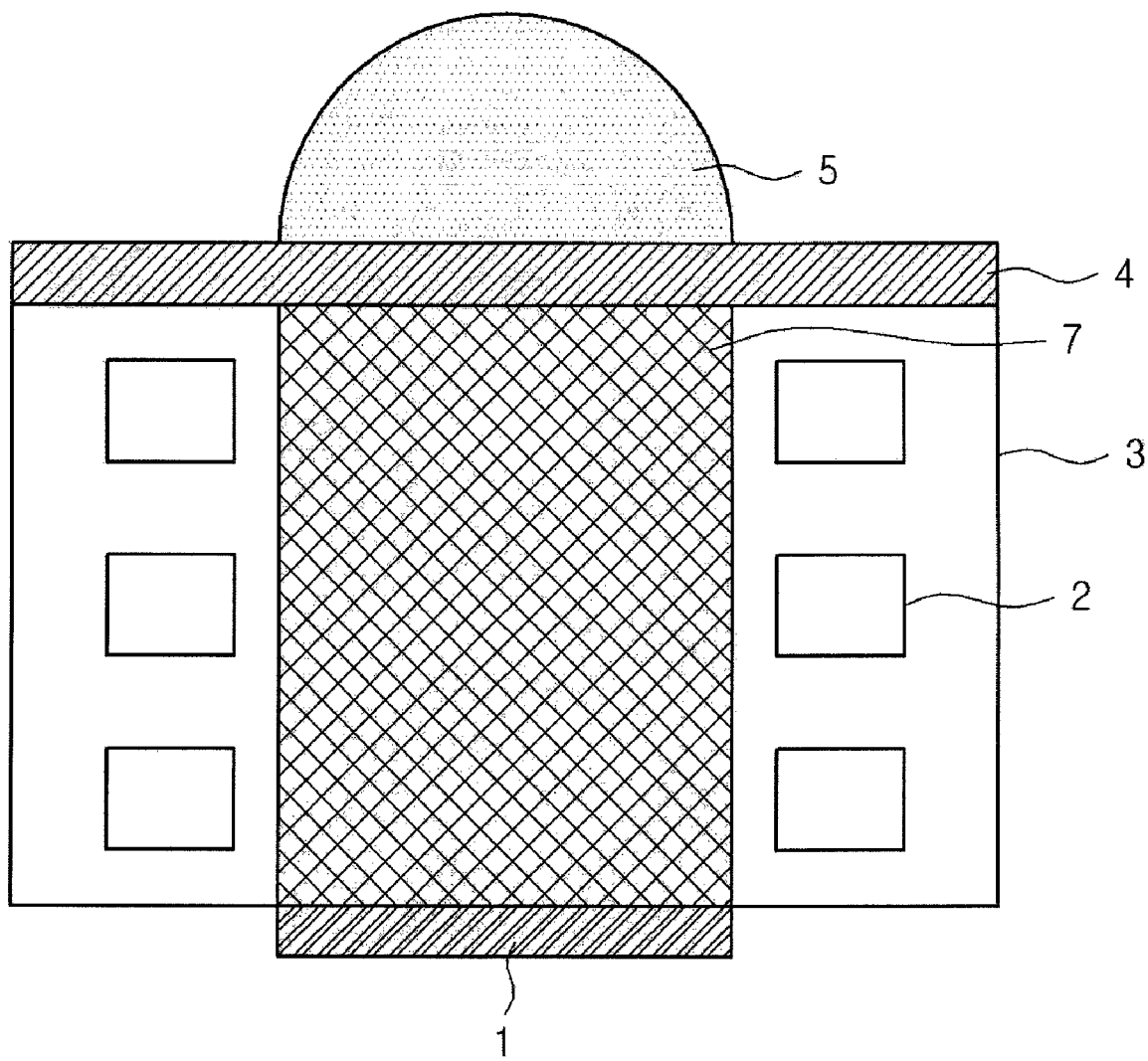

Example FIG. 4 illustrates forming a color filter 4 on and/or over IMD layer 3 and/or dielectric medium 7, in accordance with embodiments. Example FIG. 5 illustrates forming micro lens 5 on and/or over color filter 4, in accordance with embodiments.

A method of fabricating an image sensor may include forming photo diode 1 on and/or over the semiconductor substrate. One or more IMD layers 3 may be formed on and/or over the semiconductor substrate and/or a PMD layer. The image sensor may include dielectric medium 7 positioned on and/or over photo diode 1. Dielectric medium 7 may be formed in IMD layer 3 using materials with a higher refractive index than materials forming IMD layer 3. In embodiments, an image sensor may include color filter 4 formed on and/or over IMD layer 3. In embodiments, an image sensor may include micro lens 5 formed on and/or over color filter 4. In embodiments, light propagating through the dielectric medium 7 may be reflected from the boundary surface of dielectric medium 7 and IMD layer 3.

According to embodiments, since the light may be transferred irrespective of the focal length of the micro lens, constraints on the height of the metal wiring layer may be reduced and performance of an image sensor may be maximized. Performance variations due to variations in the thickness of the IMD layer may be minimized.

As illustrated in example FIG. 6, through-hole 6 may be in the form of a plurality of pipes, in accordance with embodiments. When a plurality of through-holes are in the form of a plurality of pipes, dielectric medium 7 may have a conforming shape (e.g. a plurality of rods, in accordance with embodiments.

As illustrated in example FIG. 7, through-hole 6 may be formed in the IMD layer 3 with the width of the upper portion greater than the width of the lower portion, in accordance with embodiments. When through-hole 6 has a narrowing shape, then dielectric medium 7 may have a conforming shape (e.g. a cone shape), in accordance with embodiments.

In embodiments, incident light may be transferred through dielectric medium 7 to photo diode 1. Light incident into the dielectric medium 7 may be reflected off of boundary surfaces (e.g. boundary of dielectric medium 7 and IMD layer 3) to maximize the amount of light projected into photo diode 1, in accordance with embodiments. In embodiments, light incident into dielectric medium 7 may be delivered to photo diode 1 without substantial loss in intensity, which may maximize the sensitivity of an image sensor.

In accordance with embodiments, micro lens 5 formed over dielectric medium 7 may maximize the process margin of an image sensor manufacturing process. In embodiments, the focal length of micro lens 5 may not need to be finely tuned to the location of photodiode 1, because focused (or unfocused) light may be internally reflected in dielectric medium 7 into photodiode 1

Although embodiments have been described herein, it should be understood that numerous other modifications and embodiments can be devised by those skilled in the art that will fall within the spirit and scope of the principles of this disclosure. More particularly, variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An apparatus comprising:
   a photo diode formed in a semiconductor substrate;
   at least one intermetal dielectric layer formed over the semiconductor substrate, the at least one intermetal dielectric layer having a plurality of through holes formed over and corresponding to the photo diode; and
   a dielectric medium filling each one of the plurality of a through-holes in said at least one intermetal dielectric layer.

2. The apparatus of claim 1, wherein said dielectric medium has a refractive index higher than the refractive index of said at least one intermetal dielectric layer.

3. The apparatus of claim 1, comprising a micro lens formed over said at least one intermetal dielectric layer, wherein a focal length of the micro lens is different than a height of the dielectric medium.

4. The apparatus of claim 1, comprising a micro lens formed over said at least one intermetal dielectric layer, wherein a focal length of the micro lens is substantially the same as a height of the dielectric medium.

5. The apparatus of claim 3, wherein a color filter is formed between the micro lens and the dielectric medium.

6. The apparatus of claim 1, wherein the dielectric medium comprises a plurality of layers.

7. An apparatus comprising:
   a photo diode formed in a semiconductor substrate;
   at least one intermetal dielectric layer formed over the semiconductor substrate, the at least one intermetal dielectric layer having a plurality of through holes formed over and corresponding to the photo diode;
   a dielectric medium filling each one of the plurality of through-holes in said at least one intermetal dielectric layer to contact the photo diode, wherein a width of the dielectric medium is greater in an upper portion of the dielectric medium than in a lower portion of the dielectric medium;
   a color filter formed over and contacting the at least one intermetal dielectric layer and the dielectric medium; and
   a micro lens formed over and contacting the color filter.

8. The apparatus of claim 7, wherein said dielectric medium has a refractive index higher than the refractive index of said at least one intermetal dielectric layer.

9. The apparatus of claim 7, wherein a focal length of the micro lens is different than a height of the dielectric medium.

10. The apparatus of claim 7, wherein a focal length of the micro lens is substantially the same as a height of the dielectric medium.

11. The apparatus of claim 7, wherein the dielectric medium comprises a plurality of layers.

12. A method comprising:
    forming at least one photo diode in a semiconductor substrate;
    forming at least one intermetal dielectric layer over said semiconductor substrate;
    forming a plurality of through-holes in said at least one intermetal dielectric layer over and corresponding to each one of the at least one photo diode
    filling the plurality of through-holes with a dielectric medium.

13. The method of claim 12, wherein the dielectric medium has a higher refractive index than said at least one intermetal dielectric layer.

14. The method of claim 12, wherein said filling the plurality of through-holes with the dielectric medium comprises deposition of the dielectric medium.

15. The method of claim 12, wherein said filling the plurality of through-holes with the dielectric medium comprises coating the dielectric medium.

16. The method of claim 12, wherein a width of each of the plurality of through-holes is greater in an upper portion of the through-hole than in a lower portion of the through-hole.

17. The method of claim 12, comprising:
    forming a color filter over said at least one intermetal dielectric layer; and
    forming a micro lens over the color filter.

18. The method of claim 17, wherein the focal length of the micro lens is different than a length of each of the plurality of through-holes.

19. The method of claim 17, wherein the focal length of the micro lens is the same as a length of each of the plurality of through-holes.

* * * * *